United States Patent
Rehmeyer et al.

(10) Patent No.: US 11,488,685 B2
(45) Date of Patent: Nov. 1, 2022

(54) ADJUSTABLE COLUMN ADDRESS SCRAMBLE USING FUSES

(71) Applicant: Micron Technology, Inc., Boise, ID (US)

(72) Inventors: James S. Rehmeyer, Boise, ID (US); Christopher G. Wieduwilt, Boise, ID (US); George Raad, Boise, ID (US); Seth Eichmeyer, Boise, ID (US); Dean Gans, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/308,448

(22) Filed: May 5, 2021

(65) Prior Publication Data
US 2021/0257043 A1   Aug. 19, 2021

Related U.S. Application Data

(63) Continuation of application No. 16/723,532, filed on Dec. 20, 2019, now Pat. No. 11,017,879.

(51) Int. Cl.
*G11C 29/00* (2006.01)
*G11C 17/16* (2006.01)
(Continued)

(52) U.S. Cl.
CPC ............ *G11C 29/787* (2013.01); *G11C 17/16* (2013.01); *G11C 29/027* (2013.01); *G11C 29/78* (2013.01);
(Continued)

(58) Field of Classification Search
CPC ....... G11C 17/16; G11C 29/027; G11C 29/70; G11C 29/76; G11C 29/785; G11C 29/787; G11C 2029/1806; G11C 2207/104
(Continued)

(56) References Cited

U.S. PATENT DOCUMENTS 6,108,251 A * 8/2000 Manning ................. G11C 29/76
365/200
7,405,973 B2    7/2008 Park
(Continued)

FOREIGN PATENT DOCUMENTS

CN    106257595 A    12/2016

OTHER PUBLICATIONS

Chinese Patent Office, "Notice of Allowance," issued in connection with Chinese Patent Application No. 202011301401.2 dated Jan. 12, 2022 (4 pages).

*Primary Examiner* — Son L Mai
(74) *Attorney, Agent, or Firm* — Holland & Hart LLP

(57) ABSTRACT

Methods, systems, and devices for adjustable column address scramble using fuses are described. A testing device may detect a first error in a first column plane of a memory array and a second error in a second column plane of the memory array. The testing device may identify a first column address of the first column plane associated with the first error and a second column address of the second column plane based on detecting the first error and the second error. The testing device may determine, for the first column plane, a configuration for scrambling column addresses of the first column plane to different column addresses of the first column plane. In some cases, the testing device may perform a fuse blow of a fuse associated with the first column plane to implement the determined configuration.

20 Claims, 8 Drawing Sheets

(51) Int. Cl.
    *G11C 29/02*     (2006.01)
    *G11C 29/18*     (2006.01)

(52) U.S. Cl.
    CPC ............ *G11C 29/785* (2013.01); *G11C 29/70* (2013.01); *G11C 2029/1806* (2013.01); *G11C 2207/104* (2013.01)

(58) Field of Classification Search
    USPC ................................................ 365/96, 225.7
    See application file for complete search history.

(56) References Cited

U.S. PATENT DOCUMENTS

| | | | |
|---|---|---|---|
| 9,104,588 B2 | 8/2015 | Mullarkey | |
| 9,165,684 B2 | 10/2015 | Lu et al. | |
| 9,508,456 B1 * | 11/2016 | Shim | G11C 17/18 |
| 10,957,380 B2 * | 3/2021 | Shin | G06F 3/0659 |
| 11,144,214 B2 * | 10/2021 | Carlson | G06F 3/0622 |

* cited by examiner

ADJUSTABLE COLUMN ADDRESS SCRAMBLE USING FUSES

CROSS REFERENCE

The present Application for Patent is a continuation of U.S. patent application Ser. No. 16/723,532 by Rehmeyer et al., entitled "ADJUSTABLE COLUMN ADDRESS SCRAMBLE USING FUSES," filed Dec. 20, 2019, assigned to the assignee hereof, and is expressly incorporated by reference in its entirety herein.

BACKGROUND

The following relates generally to one or more memory systems and more specifically to adjustable column address scramble using fuses.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some memory systems, a global column repair technique may be implemented to repair a column plane of the memory array. The global column repair may repair a single column plane per prefetch. For example, a memory device may repair one column in a group of column planes when using the global column repair. That is, if two column planes experience a failure on a same prefetch address (e.g., column index), the global column repair may not be able to repair both failures. In such cases, the two column planes may experience an address collision. For memory devices that experience column failures on a same column index, a local column repair may be added to each column plane, thereby increasing the size of the memory die, decreasing the efficiency of memory die operations, and causing additional errors on the memory device. To improve the yield loss due to duplicate column fails on a same address, the memory device may implement an adjustable column address scramble using fuses in the column decoder.

Functions of the memory device may be improved by performing a fuse blow of a fuse to scramble at least one of the addresses (e.g., column addresses) experiencing an address collision. When an address collision occurs, the column address mapping for one of the column planes may be scrambled to avoid collisions, thereby allowing the memory device to increase the efficiency of the memory array resources. For example, the memory device may detect that errors are occurring on a same index in at least two different column planes in a repair region. In such cases, the memory device may identify a column address of at least one of the column planes experiencing the error and determine a configuration to scramble the column address to different column address in the same column plane.

A fuse (or a fuse array) in the column decoder may be used to scramble the column addresses. For example, the memory device may blow a fuse associated with the column address experiencing the error to scramble the column address to a different column address in the same column plane. Using such scrambling techniques may decrease the likelihood that a memory device may be unrepairable using a global repair technique and reduce the yield loss caused by duplicate column address fails on a same address.

Features of the disclosure are initially described in the context of a memory system as described with reference to FIG. 1. Features of the disclosure are described in the context of a testing setup and memory arrays as described with reference to FIGS. 2-5. These and other features of the disclosure are further illustrated by and described with reference to an apparatus diagram and flowcharts that relate to adjustable column address scramble using fuses as described with references to FIGS. 6-8.

Figure 1:
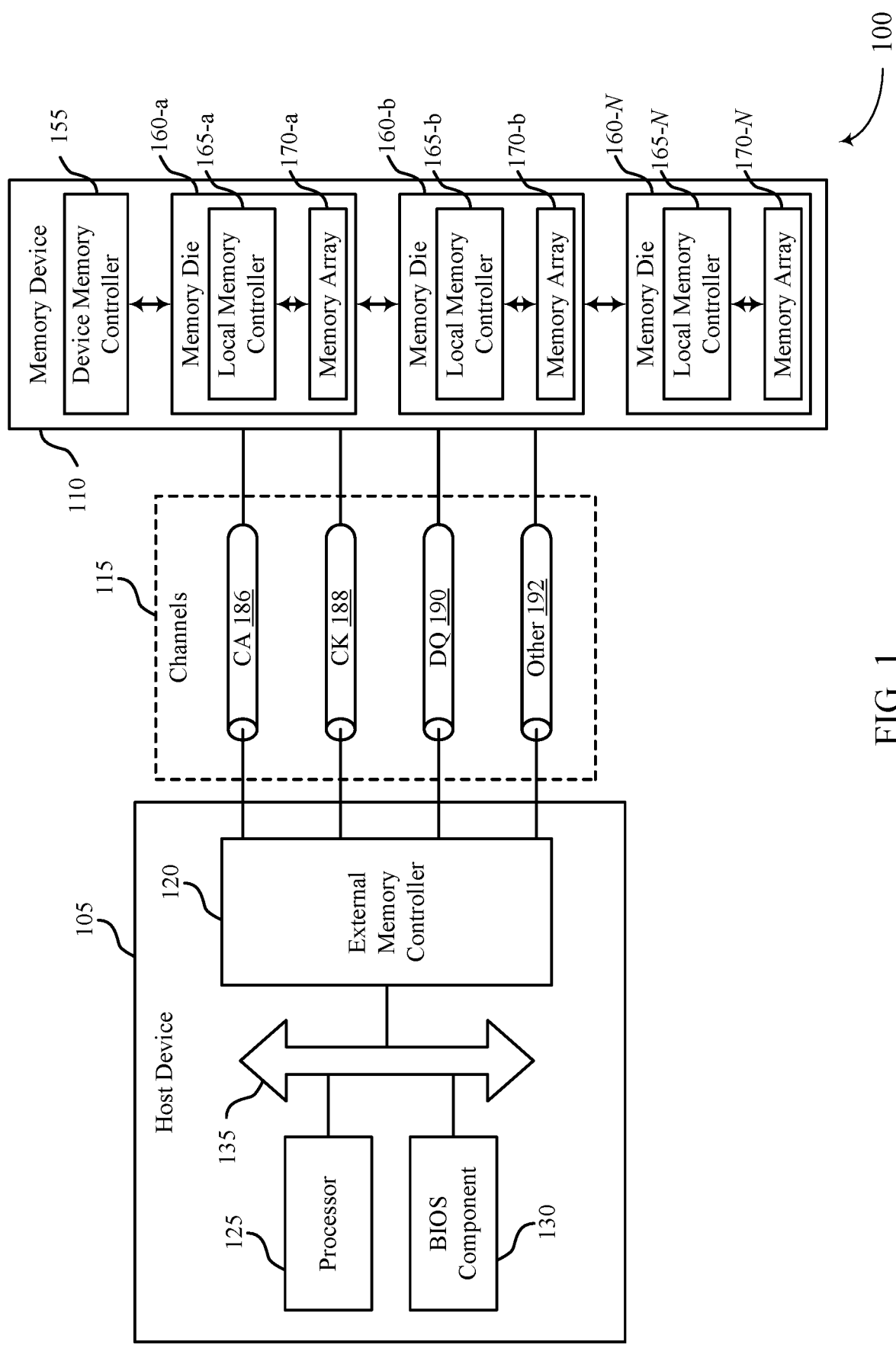
FIG. 1 illustrates an example of a system that supports adjustable column address scramble using fuses in accordance with examples as disclosed herein.

FIG. 1 illustrates an example of a system 100 that supports adjustable column address scramble using fuses in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package. In some cases, the memory array 170 may include one or more repair regions, which may include one or more column planes. Each of the one or more column planes may include multiple columns. In some case, the multiple column planes may be in the same bank. In some examples, there may be multiple banks.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In a global column repair scheme, column planes in a repair region may be repaired or replaced by columns in a single repair column plane. In some such configurations, a single prefetch column address in the repair region can be repaired or replaced at a time using the repair column plane. Thus, if the same column addresses in multiple column planes in a repair region are faulty, they may not both be able to be repaired using the single repair column plane. In some examples, the memory device 110 may detect an error in a first column plane of the memory array 170 and an error in a second column plane different than the first column plane of the same memory array 170. A column address associated with each error in the first and second column planes may be identified. In some cases, the memory device 110 may determine a scramble configuration for the first column plane to scramble the column addresses of the first column plane to different column addresses of the first column plane. For example, to implement the scramble configuration, the memory device 110 may blow a fuse associated with the first column plane.

The memory device 110 may receive a command from the host device 105. The command may include a column address of the column plane of the memory array 170. The memory device 110 may scramble the column address of the column plane based on a state of a fuse of the memory array 170 (e.g., blown or unblown). In some cases, the memory device may access a different column address of the column plane based on scrambling the column address.

Figure 2:
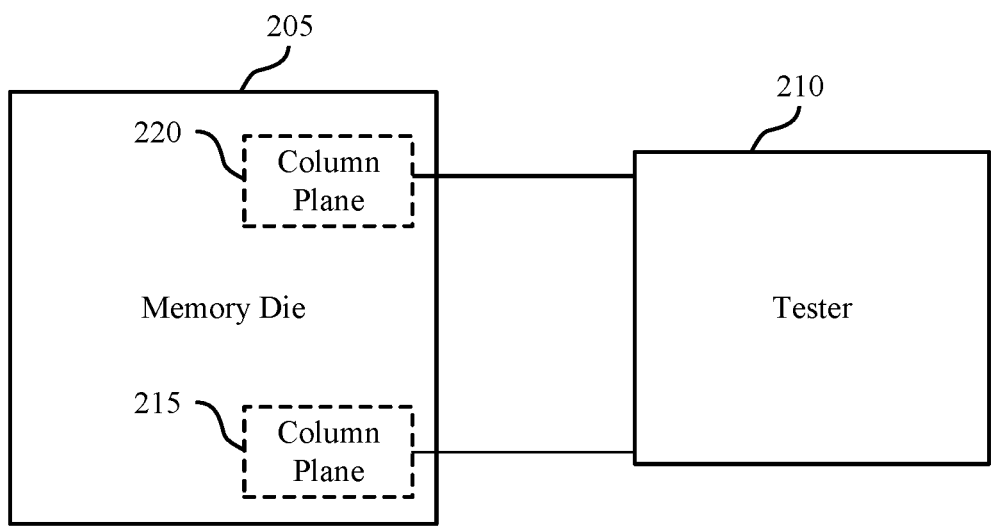
FIG. 2 illustrates an example of a testing setup that supports adjustable column address scramble using fuses in accordance with examples as disclosed herein.

FIG. 2 illustrates an example of a testing setup 200 that supports adjustable column address scramble using fuses in accordance with examples as disclosed herein.

Testing setup 200 may involve a memory die 205 being coupled with a tester 210. The memory die 205 may be an example of a memory die 160 as described with reference to FIG. 1. In some cases, the methods as described herein may be performed if an error is detected in both a first and second column plane of the memory array. Additionally or alternatively, the methods as described herein may be performed if an address collision is detected between an address of the first column plane and an address of the second column plane. In some examples, memory die 205 may be replaced by a more general logic circuit without deviating from the scope of present disclosure.

Memory die 205 may include one or more memory arrays. Each memory array may contain a different subset of the memory cells contained in the one or more memory arrays. Additionally, each memory array may include one or more access lines (e.g., word lines or bit lines), where each access line is coupled with at least one of the memory cells of the respective subset. Additionally, each access line of a memory array may be coupled with a corresponding via. In some cases, memory die 205 may include column planes 215 and 220.

Test column plane may be column planes that tester 210 uses to perform tests on the memory die 205 and non-test column planes may be column planes that tester 210 does not use to perform tests on the memory die 205. In some cases, the vias coupled with each access line of column planes 215 and 220 may be coupled with a substrate upon which the memory die 205 rests. The substrate may include one or more circuits configured to activate or deactivate the access lines of the test column plane and column plane via the via.

The memory die 205 may use a global column repair technique. For example, when using global column repair, the memory die 205 may repair one column index in a group of column planes that form a repair region. A repair region may include a single repair column plane and a plurality of column planes that are repaired using that single repair column plane. In some cases, however, the same column address in different column planes of the repair region may fail. In some examples, the memory die 205 may be configured to only repair a single column at a single column address in the repair region when using global column repair techniques, thereby making the memory die 205 unrepairable because column address failures occur at the same or similar addresses in the repair region.

The tester 210 may be configured to test a performance of memory die 205. For instance, tester 210 may detect a first error in the column plane 215 and a second error in the column plane 220 to test column plane and column plane, respectively. The tester 210 may identify a column address of each column plane 215 and column plane 220. Based on if an address collision is present between column plane 215 and column plane 220, the tester 210 may perform a fuse blow of the memory die 205 to implement a configuration for scrambling column addresses of the column plane 215 or column addresses of the column plane 220. In some cases, the communications between the tester 210 and the memory die 205 may operate with increased latency. In such cases, the memory of the tester 210 may overflow to retain information stored in the tester 210. The tester 210 may be configured to analyze the information from the test performance during a testing phase of the manufacturing process. More details about how the tester 210 performs the testing procedure may be described with reference to FIG. 3.

Figure 3:
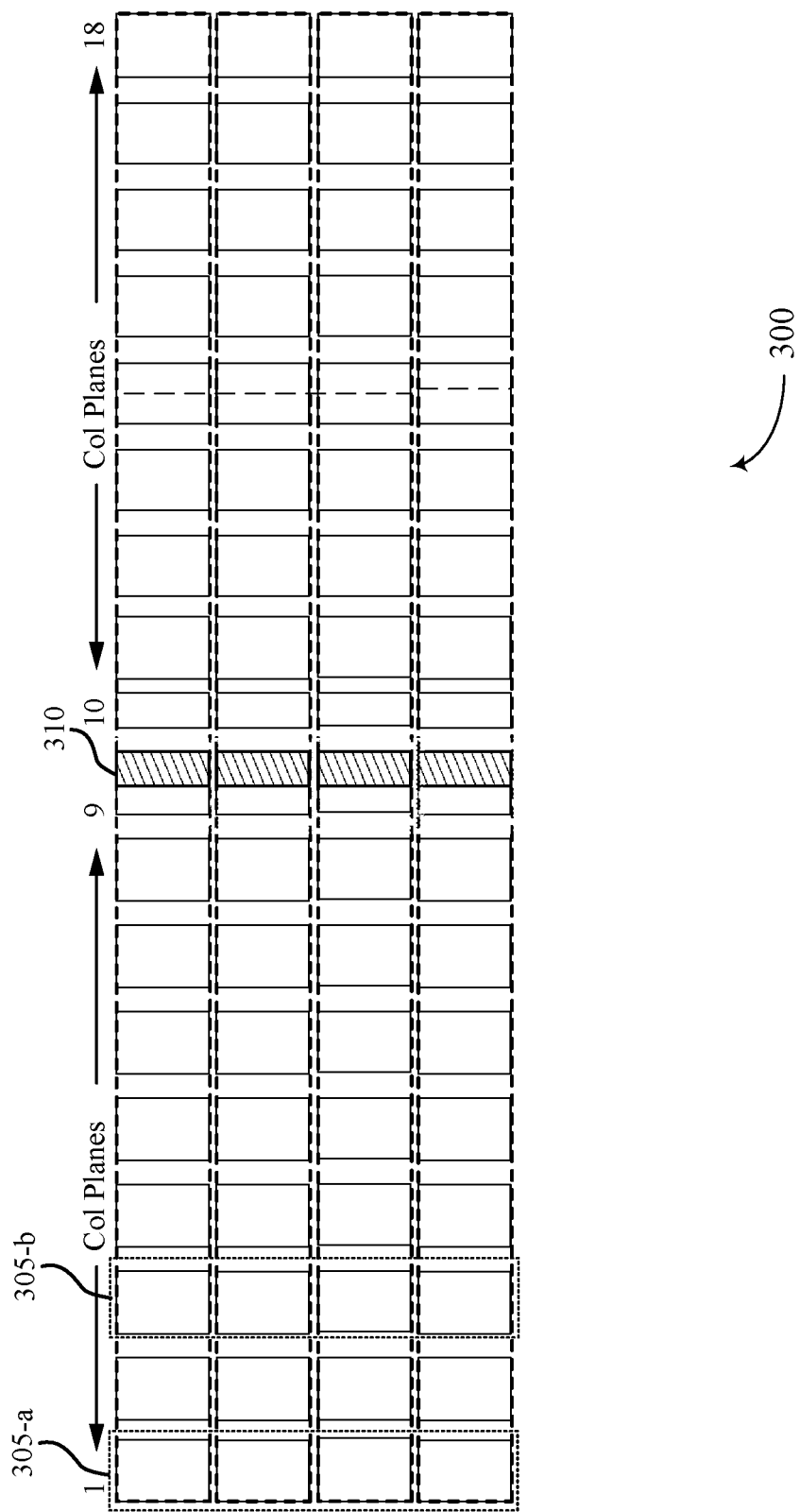
FIG. 3 illustrates an example of a column repair region that supports adjustable column address scramble using fuses in accordance with examples as disclosed herein.

FIG. 3 illustrates an example of a column repair region 300 that supports adjustable column address scramble using fuses in accordance with examples as disclosed herein. The column repair region 300 may include one or more column planes 305 (only two column planes are expressly numbered in FIG. 3) and a global column plane 310.

The column repair region 300 may include one or more column planes 305. For example, column repair region 300 may include 18 column planes, 34 column planes, or 64 column planes. In some memory systems, each column plane 305 may include a number of redundant columns that may only be used in the column repair region 300 to repair a column plane 305. For example, if the first column of column plane 305 is repaired, then the first column of every column plane 305 in the column repair region 300 may be repaired. The set of column planes 305 may be in the same bank. In some cases, there may be multiple banks. In some examples, each column plane may include multiple columns.

In memory systems that use global column repair, the column repair region 300 may include a global column plane 310 configured to repair column planes 305 in the column repair region 300. The global column plane 310 may be associated with every column plane in the column repair region 300.

The global column plane 310 may repair any of the column planes 305 in the column repair region 300. However, global column plane 310 may be configured to repair one column in one column plane 305 per prefetch. For example, the column repair region 300 may include a repair component. The repair component may be configured to receive an external command (e.g., from a tester) to perform a fuse blow to one or more fuses to repair the column plane 305. In such cases, if two or more column planes 305 experience a column failure (e.g., a first column plane 305-a and second column plane 305-b) on a same prefetch address (e.g., column address), the global column plane 310 may be unable to repair both columns using the global column plane 310, which may result in an unrepairable memory die.

For example, a single column of the first column plane 305-a may be repaired while the column of the second column plane 305-b experiencing a failure on the same address may be unrepairable by the global column plane 310, or vice-versa. The global column plane 310 may swap data on a single input/output (I/O) line outside of the memory array. Columns in the same prefetch may be accessed simultaneously. However, the logic to determine which column plane 305 is repaired may be sequential or prioritized for the same result. For example, when a defect occurs on multiple column planes 305 of the same address, the column planes 305 may be accessed in sequential order (e.g., one at a time). In such cases, the global column plane 310 may swap data on the I/O line for a single column plane 305. When columns in multiple column planes 305 fail, the amount of data on the I/O line may be exceeded, thereby preventing the global column plane 310 from repairing each column plane 305 experiencing a failure.

In some examples, the column repair region 300 may support a local column repair in addition to the global column plane 310. For example, if the column repair region 300 experiences a failure for duplicate addresses (e.g., same column address in different column planes 305), the column repair region 300 may utilize a local column repair for one failure and a global column plane for the other failure. In other examples, the column repair region 300 may use a local column repair because the local column repair repairs the same column address in multiple column planes 305 (e.g., a local column repair addresses the deficiencies of a global column repair, however; the local column repair may increase the cost). However, the addition of a local column repair may increase a size of the memory die, thereby decreasing the efficiency of the column repair region 300.

The memory array may experience a yield loss from duplicate column address fails (e.g., address collision). In some cases, the memory array may experience an increased failure rate at column addresses on the edge of the column planes 305. For example, column addresses of 0 to 3 may experience higher failure rates than column addresses 3 to 12 the column repair region 300. In such cases, an increased likelihood of duplicate address failures may occur on the edge of the column planes 305. In some cases, a yield loss can be associated with random failures occurring on the same column address in different column planes 305 in the same column repair region 300. In some examples, the size of the column repair region 300 may increase the likelihood of the address collision. For example, the larger the size of the column repair region 300, the increased chance of an address collision occurring.

In some cases, a tester may perform testing to determine whether a column repair may be required. The tester may be an example of a tester 210 as described with reference to FIG. 2. For example, the tester may identify a collision between a column address associated with a first error in a first column plane 305-a of a column repair region 300 and a different column address associated with a second error in a second column plane 305-b of a column repair region 300. In such cases, the tester may identify that an index of the column addresses are the same. Based on identifying the collision between column addresses, the tester may determine scrambling one or both of the column addresses of the first column plane 305-a and the second column plan 305-b may allow both column errors to be repair using the single global column plane 310. The memory device and the host device may be in communication to perform the testing to determine whether the column repair may be required.

Figure 4:
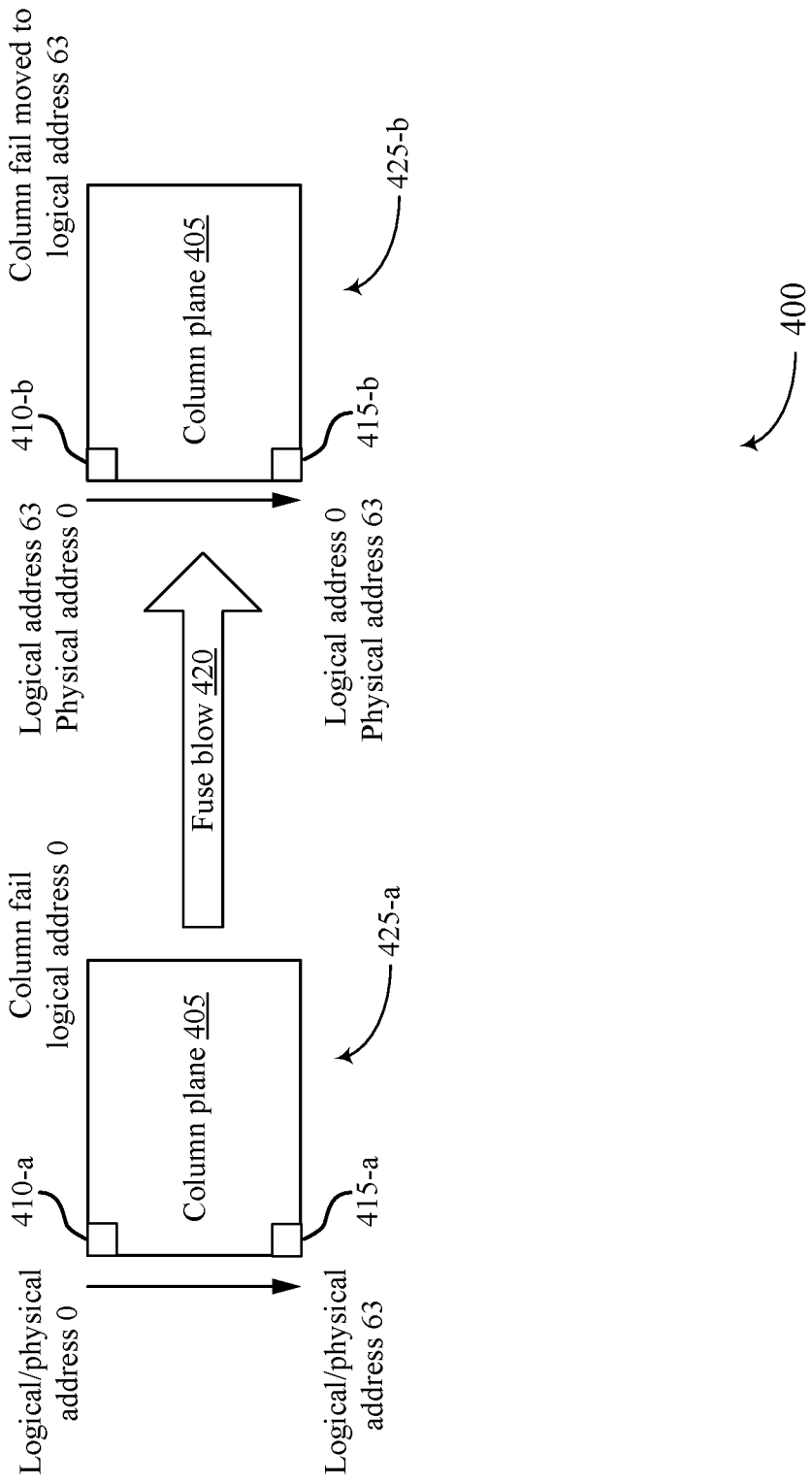
FIG. 4 illustrates an example of a block diagram that supports adjustable column address scramble using fuses in accordance with examples as disclosed herein.

FIG. 4 illustrates an example of a block diagram 400 that supports adjustable column address scramble using fuses in accordance with examples as disclosed herein. The block diagram may include a first address configuration 425-a of a column plane 405, a fuse blow 420, and a second address configuration 425-b of the column plane 405. The first address configuration 425-a may include a first column address 410-a and second column address 415-a. The second address configuration 425-b may include a first column address 410-a and second column address 415-a.

To reduce or eliminate the yield loss from a duplicate column failure in a repair region, the memory device may program a fuse to scramble the column addresses of one of the column planes involved in the duplicate column failure. For example, if a column failure of the column plane 405 collides with column failure in another column plane, the memory device may blow a fuse to adjust a logical/physical scramble of the column plane 405, thereby avoiding duplicate address fails. In such cases, the memory device may move a column plane fail from one logical address to a different logical address in the same column plane, thereby eliminating the collision (e.g., two fails occurring on a same prefetch) and enabling the repair column plane to repair both column failures.

The first address configuration 425-*a* may include logical/ physical addresses that range from 0 to 63. The first column address 410-*a* may include a logical/physical address of 0. The second column address 415-*a* may include a logical/ physical address of 63. In some examples, a column fail may occur at the logical address of 0. When the tester determines that an error occurs at a logical/physical address of 0 (e.g., the first column address 410-*a*) of column plane 405 and an error is occurring on a logical/physical address of 0 of a different column plane, the tester may perform a fuse blow 420.

The fuse blow 420 may invert the column addresses of the column plane 405 to move the column fail to a different address. In such cases, in second address configuration 425-*b*, the column fail may be moved to logical address 63. The first column address 410-*b* may include a logical address of 63 and a physical address of 0, and the second column address 415-*b* may include a logical address of 0 and a physical address of 63. The fuse blow 420 may activate an inverter to scramble the column addresses of column plane 405 to different addresses of the column plane 405.

In some cases, the fuse blow 420 may reorder the address scramble in multiple permutations to eliminate a yield loss. For example, the fuse blow 420 may toggle the column addresses from a minimum-maximum column address order to a maximum-minimum column address order (e.g., an inversion). One or more fuses may be added to column decoder of the memory device to invert any one or multiple bits of the column addresses. In some cases, the fuse blow 420 of one or more fuses may reorder the column addresses of 0 to 63 to be 31 to 0 and 63 to 32 on the column plane 405. In some cases, the fuse blow 420 of one or more fuses may reorder the column addresses of 0 to 63 to be 15 to 0, 31 to 16, 47 to 21, and 63 to 48 on the column plane 405. The memory device may include any quantity of fuses to enable any column address scramble. For example, the memory device may include one, two, three, four, five, six, seven, or eight fuses for enabling column address scrambling.

To reduce the number of fuses implemented in the memory device, a single set of inverting fuses may be implemented per group of column planes 405. In some cases, the reorder of the column addresses may be supported on a per column plane basis or a per group of column planes basis. For example, the memory device may scramble the column addresses for every column plane in the memory die, every 8 column planes in the memory die, or a predetermined amount of alternating column planes in the memory die. In some examples, the address scramble may be implemented on a per section basis, per group of sections basis, or a per memory bank basis. For example, the memory device may invert column addresses for half of the column planes for every memory bank.

Figure 5:
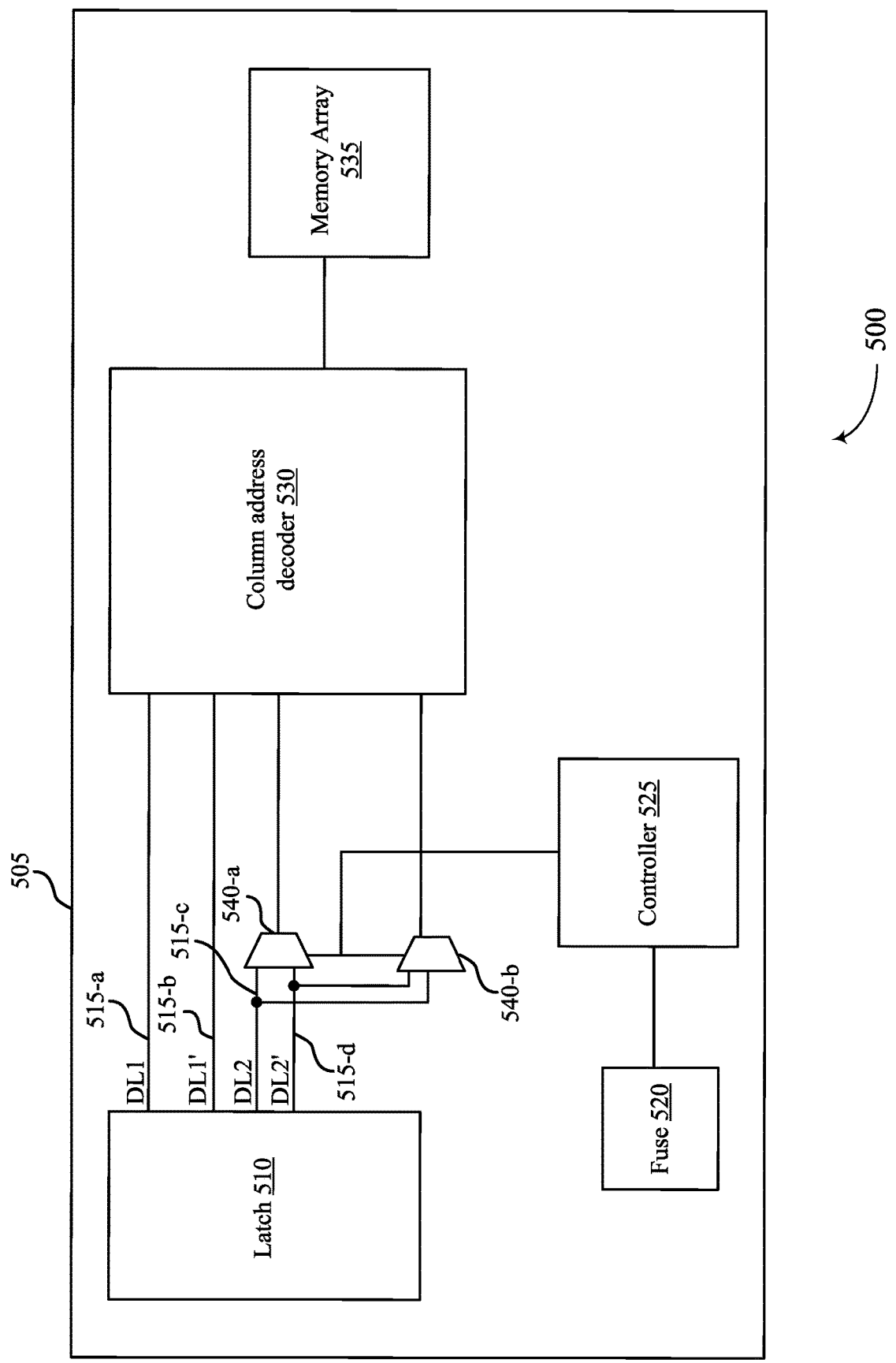
FIG. 5 illustrates an example of a system that supports adjustable column address scramble using fuses in accordance with examples as disclosed herein.

FIG. 5 illustrates an example of a system 500 that supports adjustable column address scramble using fuses in accordance with examples as disclosed herein. The system 500 may include memory device 505, latch 510, controller 525, column address decoder 530, and memory array 535. The memory device 505, controller 525, and memory array 535 may be an example of a memory device, controller, and memory array as described with reference to FIGS. 1-4. The memory array 535 may include one or more column planes that each include a plurality of columns.

The memory device 505 may receive a command comprising a column address of a column plane of the memory array 535. The command may be an example of a read command or write command. In some cases, the memory device 505 may include a latch 510 configured to select the column address included in the command. The latch 510 may be in electronic communication with the column address decoder 530 via column address bits 515-*a*, 515-*b*, 515-*c*, and 515-*d*. Column address bits 515-*a* may be an example of a first column address bit, and column address bit 515-*b* may be an example of a complimentary first column address bit. Column address bit 515-*c* may be an example of a second column address bit, and column address bit 515-*d* may be an example of a complimentary second column address bit.

Column address bit 515-*a* and column address bit 515-*b* may be configured to pass through a value (e.g., column address value) selected to access the column address. In some cases, column address bit 515-*c* and column address bit 515-*d* may be configured to pass through a value selected to access the column address depending on a state of fuse 520. In some cases, the state of fuse 520 may be determined based on the command. If fuse 520 may be in a default state (e.g., unblown), then the value selected to access the column address may pass through via column address bit 515-*c* and column address bit 515-*d*.

In some cases, the memory device 505 may detect an error in a first column plane of the memory array 535 and an error in a second column plane of the memory array 535. The memory device 505 may then identify an address of the error in the first column plane and an address of the error in the second column plane. In some cases, the memory device 505 (or the tester, as the case may be) may identify an address collision between the address of the first column plane and the address of the second column plane experiencing the errors. In such cases, the memory device 505 may identify that an index of the address of the first column plane is the same index as the address of the second column plane, thereby indicating an address collision.

The memory device 505 (or the tester, as the case may be) may determine a configuration for scrambling the address of the first column plane based on identifying the collision and identifying the index. In order to implement the configuration for scrambling the address of the first column plane, the memory device 505 may perform a fuse blow to fuse 520. The address of the first column plane may be scrambled to a different address of the first column plane based on performing the fuse blow to fuse 520.

In such cases, fuse 520 may be configured to scramble a column address to a different column address of the plane based on the configuration when fuse 520 is blown. For example, fuse 520 may invert one or more bits of the address input into the column address decoder 530 when fuse 520 is blown. In some examples, a voltage source may be coupled with fuse 520 to apply a voltage a perform the fuse blow. In such cases, the voltage source may apply a voltage to fuse 520 based on the configuration, where the voltage satisfies a voltage threshold of the fuse 520 that the voltage is applied to. The fuse blow may occur based on the voltage applied.

In some examples, the fuse 520 may be located elsewhere on the memory device 505 (i.e., a fuse array). The state of the fuse 520 may be broadcasted to local latches (e.g., latch 510) associated with the memory device 505 during initialization and for use during operation. The local latch (e.g., latch 510) may be located near the column address decoder 530 and used to scramble the addressing.

The fuse may be coupled with a multiplexer 540-a and a multiplexer 540-b via the controller 525. In some examples, fuse 520 may be an example of an anti-fuse. In some examples, the multiplexer 540-a and the multiplexer 540-b may each be an example of an inverter or a multiplexer. The fuse 520 may latch the signal that controls the multiplexer 540-a and the multiplexer 540-b. In some examples, multiplexer 540-a may be configured to invert a first value (e.g., at least one bit of the address of the first column plane) on column address bit 515-c and transmit the first value via column address bit 515-d to the column address decoder 530 when the fuse 520 is in a low state. The low state may be representative of the fuse 520 receiving a voltage that is below the voltage threshold of the fuse 520. In such cases, the first value may be output onto the column address decoder 530 via column address bit 515-d after multiplexer 540-a. In other examples, the multiplexer 540-b may be configured to invert a second value (e.g., at least one bit of the address of the first column plane) on column address bit 515-d and transmit the second value via column address bit 515-c to the column address decoder 530 when the fuse is in the low state. In such cases, the second value may be output onto the column address decoder 530 via column address bit 515-c after multiplexer 540-b.

In other examples, if the fuse 520 is in a high state, multiplexer 540-a may be configured to pass a first value (e.g., at least one bit of the address of the first column plane) on column address bit 515-c and transmit the first value via column address bit 515-c to the column address decoder 530. In such cases, the multiplexer 540-a may refrain from inverting the first value, and the first value may be output onto the column address decoder 530 via column address bit 515-c after multiplexer 540-a. The high state may be representative of the fuse 520 receiving a voltage that satisfies or is above the voltage threshold of the fuse 520. In other examples, the multiplexer 540-b may be configured to pass a second value (e.g., at least one bit of the address of the first column plane) on column address bit 515-d and transmit the second value via column address bit 515-d to the column address decoder 530 when the fuse is in the high state. In such cases, the second value may be output onto the column address decoder 530 via column address bit 515-d after multiplexer 540-b. thereby refraining from inverting the second value.

In one example, if fuse 520 is activated (e.g., blown), then the value selected to access the column address may be scrambled or inverted. In such cases, the memory device 505 may scramble the column address based on the state of fuse 520. After fuse 520 is blown, the controller 525 may determine if an error (e.g., address collision) occurred in the memory array 535. Different scrambling patterns may be possible based on which bit of the column address the fuse(s) are used to invert the bit. For more complex scrambles, one or more fuse(s) may be positioned to invert two or more bits of the column addresses of a column plane.

The controller 525 (or the tester, as the case may be) may determine the configuration for scrambling the column addresses of one or more column planes. In such cases, the controller 525 may be an example of a fuse programmable scrambler. In some examples, the controller 525 may be configured to modify the column addresses based on the output received from fuse 520. For example, the controller 525 may perform a fuse blow to fuse 520 to scramble the column address according to a configuration. The fuse 520 may output the scrambled column address, and the controller 525 may transmit the output received from the fuse 520 to the multiplexer 540-a and multiplexer 540-b. In such cases, the controller 525 may instruct the multiplexer 540-a and multiplexer 540-b to switch the output of the multiplexer 540-a and multiplexer 540-b according to the configuration (e.g., scrambled column address). In some cases, the fuse 520 may be directly coupled with the multiplexer 540-a and the multiplexer 540-b. In such cases, the multiplexer 540-a and the multiplexer 540-b may receive the output from the fuse 520 and switch the output of the multiplexer 540-a and multiplexer 540-b according to the output received from the fuse 520.

The column address may be manipulated via the configuration determined by the controller 525. For example, the controller 525 may determine a configuration to invert one or more bits of the column addresses of the column plane. In some cases, the configuration may an example of the address configurations as described in reference to FIG. 4. System 500 may be an example of an implementation; however, any number of latches 510, column address bits 515, fuse 520, controller 525, column address decoders 530, or memory arrays 535 may be implemented into system 500.

In some cases, an additional fuse may be implemented after fuse 520. For example, the additional fuse implemented after fuse 520 may operate as a 2-stage fuse. For example, the first fuse (e.g., fuse 520) may operate according to the configuration provided by the controller 525. If the fuse 520 fails to operate according to the configuration, the controller 525 may route the instructions to the additional fuse to implement the configuration. In some cases, fuse 520 may include control logic to verify if fuse 520 failed or completed the configuration.

The column address decoder 530 may be configured to access a column of the column plane during an access operation based on an address input into the column address decoder 530. The address input in to the column address decoder 530 may be supplied via column address bit 515-a, 515-b, 515-c, and 515-d. In some cases, the column address decoder 530 may change internal to the memory device 505 and internal to the memory bank based on the configuration. In some case, the column address decoder 530 may be unique per memory bank, per column repair region, or per memory array 535. When fuse 520 performs a fuse blow, the fuse 520 may change the structure of the column address decoder 530, thereby sending the command to a new logical address (e.g., via column address bit 515-d) instead of sending the command to former logic address (e.g., via column address bit 515-c).

The controller 525 may configure the address scramble prior to performing the fuse blow. In some cases, the controller 525 may be coupled with more than one fuse 520. In such cases, the controller 525 may determine (e.g., identify) which fuse to perform the fuse blow based on the configuration. In some cases, the controller 525 may determine which column plane of the memory array 535 to perform the fuse blow. In such cases, fuse 520 may directly impact the addressing in the column address decoder 530. Incorporating a fuse-based address scramble may maximize the yield of the memory device 505, thereby enabling the memory device 505 to address the scramble based on yield and defects. In some cases, the memory device 505 may access a column address of the column plane different from the column address received in the initial based on the scrambling. The accessed column address may be determined based on receiving the command and the state of the fuse 520.

In some cases, the controller 525 may determine if defects in the memory array 535 are repairable. For example, the controller 525 may generate a map of the defects associated with the repair region and determine the column addresses of the defect based on the mapping. The map of defects may be generated based on a detection of an address collision in the memory array 535. In some cases, the controller 525 may determine the configuration (e.g., address scramble configuration) based on the map of defects. For example, the different column planes or groups of column planes may get different address scrambles to ensure that the failures in the repair region are repairable using the global repair column plane of the repair region. The controller 525 may determine if the defect associated with the column address is repairable by the global column repair. If the defect is repairable by the global column repair, the fuse 520 may redirect the column address to a global column repair component to repair the column plane. In such cases, the global column repair component may activate a set of fuses different than fuse 520 to repair the column plane. The set of fuses may include seven to eight fuses to address the defect and enable the repair.

If the defect is unrepairable by the global column repair, the controller 525 may configure an address scramble and perform a fuse blow according to the configuration. In some cases, the controller 525 may determine if the defects (e.g., errors occurring in the address collision) are repairable by an error correction code (ECC). If the defect is repairable by the global column repair or the ECC, then the controller 525 may refrain from configuring an address scramble and performing the fuse blow. A defect unrepairable by the ECC may be an example of an ECC collision. If the defect is unrepairable by the ECC, the controller 525 may determine a configuration to scramble the address. In some cases, the configuration of the address scramble may be based on an order of when the defect occurred, how many defects occurred, or both. In some examples, the ECC collision may occur independently of the global column repair address collision. For example, the ECC collision and local column repair may benefit from the scrambling the address because re-scrambling a column plane to avoid an ECC collision may prevent the memory die 505 from using a repair technique (i.e., instead of the ECC logic correcting the failing bit after the scramble).

Figure 6:
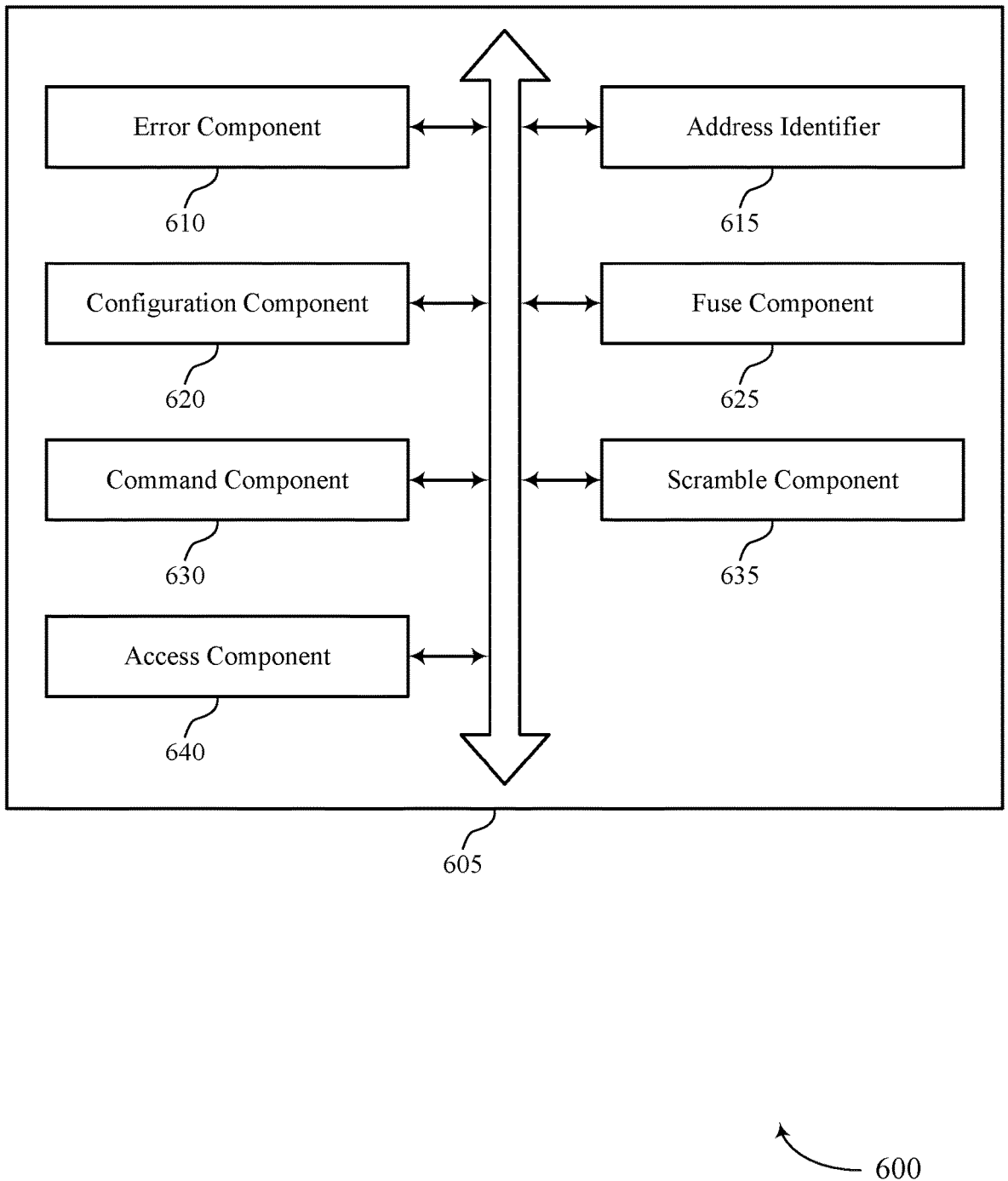
FIG. 6 shows a block diagram of a memory device that supports adjustable column address scramble using fuses in accordance with examples as disclosed herein.

FIG. 6 shows a block diagram 600 of a memory device 605 that supports adjustable column address scramble using fuses in accordance with examples as disclosed herein. The memory device 605 may be an example of aspects of a memory device as described with reference to FIGS. 1 through 5. The memory device 605 may include an error component 610, an address identifier 615, a configuration component 620, a fuse component 625, a command component 630, a scramble component 635, and an access component 640. Each of these modules may communicate, directly or indirectly, with one another (e.g., via one or more buses).

The error component 610 may detect a first error in a first column plane of a memory array and a second error in a second column plane of the memory array. In some examples, the error component 610 may identify a collision between the first column address associated with the first error and the second column address of the second error, where determining the configuration is based on identifying the collision.

In some examples, the error component 610 may determine that the first error or the second error is unrepairable by an ECC, where determining the configuration is based on determining that the first error or the second error is unrepairable by the ECC. In some examples, the error component 610 may generate a map of errors in the memory array based on detecting the first error in the first column plane and the second error in the second column plane, where determining the configuration is based on generating the map of errors.

The address identifier 615 may identify a first column address of the first column plane associated with the first error and a second column address of the second column plane based on detecting the first error and the second error. In some examples, the address identifier 615 may identify that an index of the first column address in the first column plane is the same as the index of the second column address in the second column plane, where identifying the collision is based on identifying that the index is the same.

The configuration component 620 may determine, for the first column plane, a configuration for scrambling column addresses of the first column plane to different column addresses of the first column plane based on identifying the first column address and the second column address. In some examples, the configuration component 620 may scramble the column addresses of the first column plane to the different column addresses of the first column plane based on performing the fuse blow, where accessing columns of the first column plane is based on scrambling the column addresses.

The fuse component 625 may perform a fuse blow associated with the first column plane to implement the determined configuration based on determining the configuration. In some examples, the fuse component 625 may invert at least one bit of the first column address of the first column plane based on performing the fuse blow, where accessing columns of the first column plane is based on inverting the at least one bit of the first column address.

In some examples, the fuse component 625 may activate, using a global column repair component, a set of fuses to repair the first column plane of the memory array or the second column plane of the memory array based on performing the fuse blow, where the set of fuses is different than the fuse. In some examples, the fuse component 625 may identify the fuse to perform the fuse blow based on determining the configuration, where performing the fuse blow is based on identifying the fuse. In some examples, the fuse component 625 may apply a voltage to the fuse that satisfies a voltage threshold of the fuse based on determining the configuration, where performing the fuse blow is based on applying the voltage.

The command component 630 may receive a command including a first column address of a first column plane. In some cases, the command is a read command or a write command.

The scramble component 635 may scramble the first column address based on a state of a fuse associated with scrambling column addresses of the first column plane. In some examples, the scramble component 635 may scramble the first column address indicates a first error in the first column plane and a second error in a second column plane, where scrambling the first column address is based on the first error and the second error.

The access component 640 may access a second column address of the first column plane different than the first column address based on scrambling the first column address. In some examples, the access component 640 may determine the second column address of the first column plane based on receiving the command and the state of the fuse, where accessing the second column address is based on determining the second column address. In some examples, the access component 640 may determine the state of the fuse based on receiving the command, where accessing the second column address is based on determining the state of the fuse.

Figure 7:
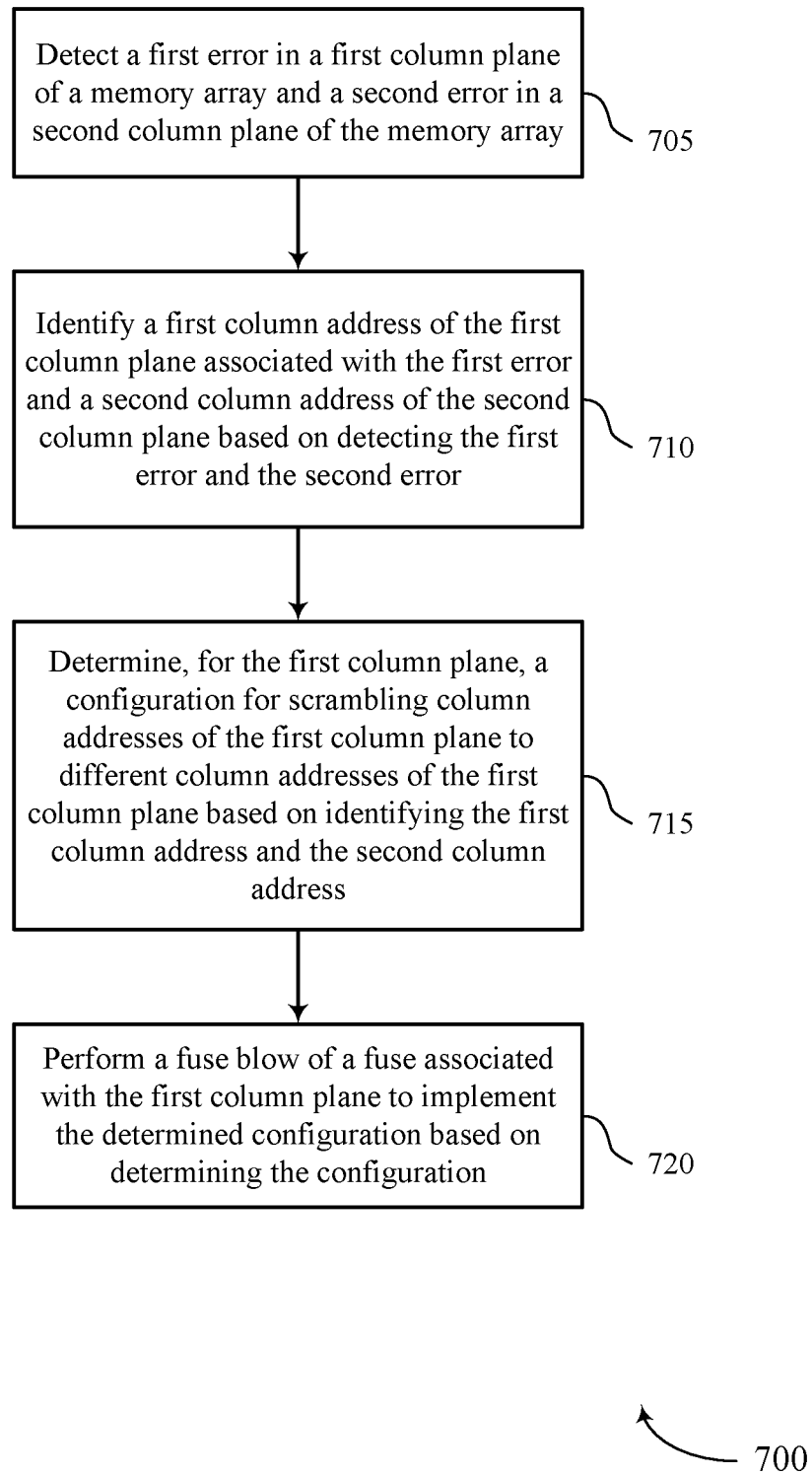
FIGS. 7 and 8 show flowcharts illustrating a method or methods that support adjustable column address scramble using fuses in accordance with examples as disclosed herein.

FIG. 7 shows a flowchart illustrating a method or methods 700 that supports adjustable column address scramble using fuses in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware. In some examples, the features of the method 700 may be performed by a memory device, a tester, or any combination thereof.

At 705, the memory device may detect a first error in a first column plane of a memory array and a second error in a second column plane of the memory array. The operations of 705 may be performed according to the methods described herein. In some examples, aspects of the operations of 705 may be performed by an error component as described with reference to FIG. 6.

At 710, the memory device may identify a first column address of the first column plane associated with the first error and a second column address of the second column plane based on detecting the first error and the second error. The operations of 710 may be performed according to the methods described herein. In some examples, aspects of the operations of 710 may be performed by an address identifier as described with reference to FIG. 6.

At 715, the memory device may determine, for the first column plane, a configuration for scrambling column addresses of the first column plane to different column addresses of the first column plane based on identifying the first column address and the second column address. The operations of 715 may be performed according to the methods described herein. In some examples, aspects of the operations of 715 may be performed by a configuration component as described with reference to FIG. 6.

At 720, the memory device may perform a fuse blow of a fuse associated with the first column plane to implement the determined configuration based on determining the configuration. The operations of 720 may be performed according to the methods described herein. In some examples, aspects of the operations of 720 may be performed by a fuse component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for detecting a first error in a first column plane of a memory array and a second error in a second column plane of the memory array, identifying a first column address of the first column plane associated with the first error and a second column address of the second column plane based on detecting the first error and the second error, determining, for the first column plane, a configuration for scrambling column addresses of the first column plane to different column addresses of the first column plane based on identifying the first column address and the second column address, and performing a fuse blow of a fuse associated with the first column plane to implement the determined configuration based on determining the configuration.

Some examples of the method 700 and the apparatus described herein may further include operations, features, means, or instructions for scrambling the column addresses of the first column plane to the different column addresses of the first column plane based on performing the fuse blow, where accessing columns of the first column plane may be based on scrambling the column addresses. Some examples of the method 700 and the apparatus described herein may further include operations, features, means, or instructions for inverting at least one bit of the first column address of the first column plane based on performing the fuse blow, where accessing columns of the first column plane may be based on inverting the at least one bit of the first column address. Some examples of the method 700 and the apparatus described herein may further include operations, features, means, or instructions for identifying a collision between the first column address associated with the first error and the second column address of the second error, where determining the configuration may be based on identifying the collision.

Some examples of the method 700 and the apparatus described herein may further include operations, features, means, or instructions for identifying that an index of the first column address in the first column plane may be the same as the index of the second column address in the second column plane, where identifying the collision may be based on identifying that the index may be the same. Some examples of the method 700 and the apparatus described herein may further include operations, features, means, or instructions for determining that the first error or the second error may be unrepairable by an ECC, where determining the configuration may be based on determining that the first error or the second error may be unrepairable by the ECC.

Some examples of the method 700 and the apparatus described herein may further include operations, features, means, or instructions for activating, using a global column repair component, a set of fuses to repair the first column plane of the memory array or the second column plane of the memory array based on performing the fuse blow, where the set of fuses is different than the fuse. Some examples of the method 700 and the apparatus described herein may further include operations, features, means, or instructions for generating a map of errors in the memory array based on detecting the first error in the first column plane and the second error in the second column plane, where determining the configuration may be based on generating the map of errors.

Some examples of the method 700 and the apparatus described herein may further include operations, features, means, or instructions for identifying the fuse to perform the fuse blow based on determining the configuration, where performing the fuse blow may be based on identifying the fuse. Some examples of the method 700 and the apparatus described herein may further include operations, features, means, or instructions for applying a voltage to the fuse that satisfies a voltage threshold of the fuse based on determining the configuration, where performing the fuse blow may be based on applying the voltage.

Figure 8:
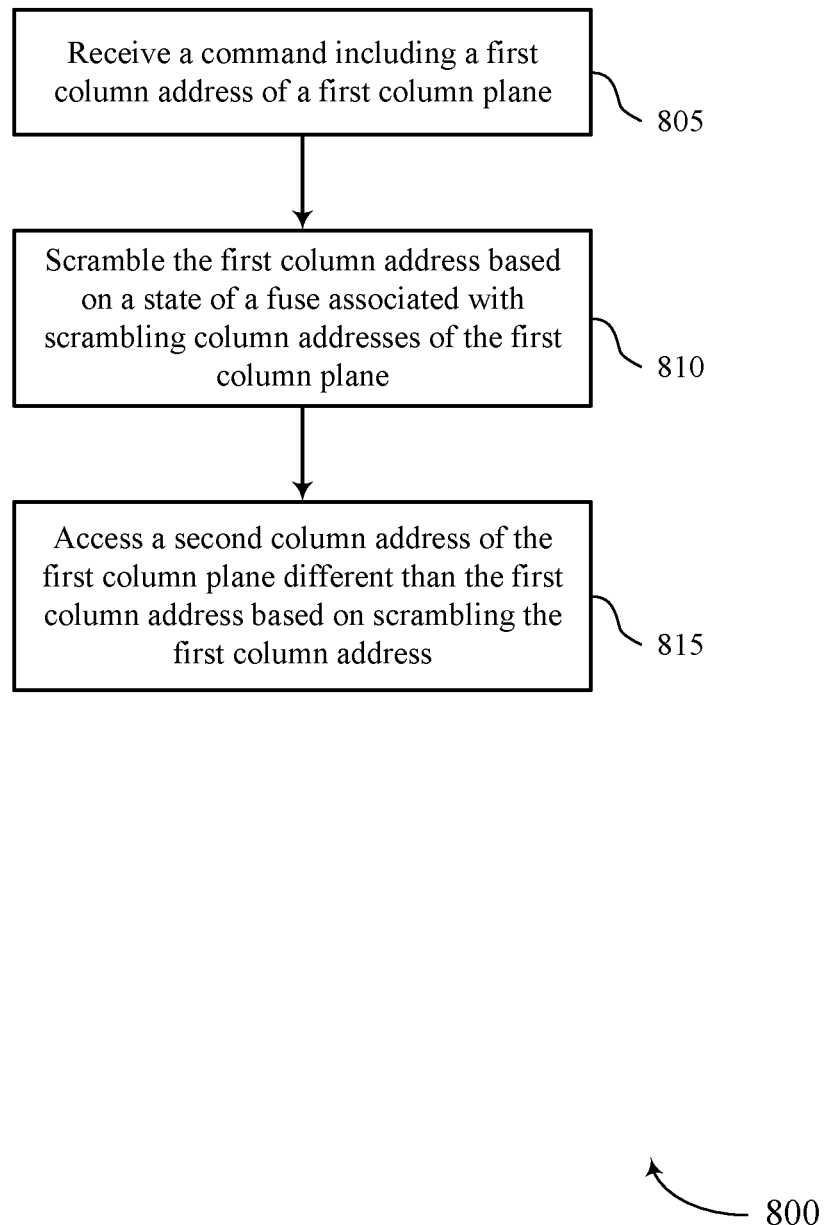

FIG. 8 shows a flowchart illustrating a method or methods 800 that supports adjustable column address scramble using fuses in accordance with examples as disclosed herein. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may receive a command including a first column address of a first column plane. The operations of 805 may be performed according to the methods described herein. In some examples, aspects of the operations of 805 may be performed by a command component as described with reference to FIG. 6.

At 810, the memory device may scramble the first column address based on a state of a fuse associated with scrambling column addresses of the first column plane. The operations of 810 may be performed according to the methods described herein. In some examples, aspects of the operations of 810 may be performed by a scramble component as described with reference to FIG. 6.

At 815, the memory device may access a second column address of the first column plane different than the first column address based on scrambling the first column address. The operations of 815 may be performed according to the methods described herein. In some examples, aspects of the operations of 815 may be performed by an access component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for receiving a command including a first column address of a first column plane, scrambling the first column address based on a state of a fuse associated with scrambling column addresses of the first column plane, and accessing a second column address of the first column plane different than the first column address based on scrambling the first column address.

Some examples of the method 800 and the apparatus described herein may further include operations, features, means, or instructions for determining the second column address of the first column plane based on receiving the command and the state of the fuse, where accessing the second column address may be based on determining the second column address. Some examples of the method 800 and the apparatus described herein may further include operations, features, means, or instructions for determining the state of the fuse based on receiving the command, where accessing the second column address may be based on determining the state of the fuse.

Some examples of the method 800 and the apparatus described herein may further include operations, features, means, or instructions for scrambling the first column address indicates a first error in the first column plane and a second error in a second column plane, where scrambling the first column address may be based on the first error and the second error. In some examples of the method 800 and the apparatus described herein, the command may be a read command or a write command.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including one or more column planes that each include a set of columns, a column address decoder configured to access a column of a column plane during an access operation based on an address input into the column address decoder, and one or more fuses coupled with an input of the column address decoder and for implementing a configuration for scrambling column addresses of the column plane to different column addresses of the column plane when at least one of the one or more fuses is blown.

Some examples of the apparatus may include a fuse programmable scrambler configured to determine the configuration for scrambling the column addresses of the column plane to the different column addresses of the column plane. In some examples, the one or more fuses may be configured to scramble one or more bits of the address input into the column address decoder when at least one of the one or more fuses may be blown. Some examples of the apparatus may include a first column plane of the one or more column planes associated with a first error, and a second column plane of the one or more column planes associated with a second error. In some examples, a voltage source coupled with a fuse of the one or more fuses and configured to apply a voltage to the fuse to perform a fuse blow.

Some examples of the apparatus may include a repair component configured to perform a fuse blow to one or more fuses to repair the one or more column planes. In some examples, the one or more fuses may be configured to redirect a column address of the one or more column planes to a global column repair component to repair the one or more column planes. In some examples, the one or more fuses include one or more anti-fuses. Some examples of the apparatus may include a latch coupled with the one or more column planes. In some examples, the configuration for scrambling column addresses is implemented on a per column plane basis, a per group of column plane basis, a per section basis, or a per group of sections basis.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
performing a fuse blow of a fuse associated with a column plane to implement a configuration for scrambling column addresses of the column plane to different column addresses of the column plane;
inverting, using one or more multiplexers, at least one bit of a column address of the column plane based at least in part on performing the fuse blow; and
accessing columns of the column plane based at least in part on inverting the at least one bit of the column address.

2. The method of claim 1, further comprising:
determining that a voltage associated with the fuse fails to satisfy a threshold based at least in part on performing the fuse blow, wherein inverting the at least one bit of the column address is based at least in part on determining that the voltage fails to satisfy the threshold.

3. The method of claim 2, further comprising:
transmitting, to a column address decoder, a value associated with the at least one bit based at least in part on determining that the voltage fails to satisfy the threshold.

4. The method of claim 2, further comprising:
inverting at least one other bit of the column address of the column plane based at least in part on performing the fuse blow; and
transmitting, to a column address decoder, a value associated with the at least one other bit based at least in part on determining that the voltage fails to satisfy the threshold.

5. The method of claim 1, further comprising:
determining that a voltage of the fuse satisfies a threshold based at least in part on performing the fuse blow.

6. The method of claim 5, further comprising:
refraining from inverting at least one other bit of the column address of the column plane based at least in part on determining that the voltage satisfies the threshold.

7. The method of claim 1, further comprising:
scrambling the column addresses of the column plane to the different column addresses of the column plane based at least in part on inverting the at least one bit of the column address of the column plane, wherein accessing the columns of the column plane is based at least in part on scrambling the column addresses.

8. The method of claim 1, further comprising:
determining whether an error occurred in a memory array based at least in part on performing the fuse blow, wherein the configuration is based at least in part on determining that the error occurred in the memory array.

9. An apparatus, comprising:
a memory array comprising one or more column planes;
a column address decoder configured to access a column of a column plane during an access operation;
one or more fuses coupled with the column address decoder and for implementing a configuration for scrambling column addresses of the column plane to different column addresses of the column plane; and
one or more multiplexers coupled with the one or more fuses and for inverting at least one bit of a column address of the column plane.

10. The apparatus of claim 9, wherein the one or more multiplexers comprises a first multiplexer configured to invert a first value of a first column address bit when the one or more fuses is in a first state, wherein the first value comprises the at least one bit of the column address of the column plane.

11. The apparatus of claim 10, wherein the first multiplexer is configured to transmit, to the column address decoder, the first value when the one or more fuses is in the first state.

12. The apparatus of claim 10, wherein the one or more multiplexers comprises a second multiplexer configured to invert a second value of a second column address bit when the one or more fuses is in the first state, wherein the second value comprises at least one other bit of the column address of the column plane.

13. The apparatus of claim 12, wherein the second multiplexer is configured to transmit, to the column address decoder, the second value when the one or more fuses is in the first state.

14. The apparatus of claim 9, wherein the one or more multiplexers are configured to scramble one or more bits of addresses input into the column address decoder when at least one of the one or more fuses is blown.

15. The apparatus of claim 9, wherein the one or more multiplexers are configured to switch one or more bits of addresses input to the column address decoder according to the configuration.

16. The apparatus of claim 9, further comprising:
a voltage source coupled with a fuse of the one or more fuses and configured to apply a voltage to the fuse to perform a fuse blow.

17. An apparatus, comprising:
a memory array comprising a column plane;
a fuse coupled with the memory array;
a multiplexer coupled with the fuse; and
a controller coupled with the multiplexer and configured to cause the apparatus to:

perform a fuse blow of the fuse associated with the column plane to implement a configuration for scrambling column addresses of the column plane to different column addresses of the column plane;

invert, using the multiplexer, at least one bit of a column address of the column plane based at least in part on performing the fuse blow; and access columns of the column plane based at least in part on inverting the at least one bit of the column address.

18. The apparatus of claim 17, wherein the controller is further configured to cause the apparatus to:

determine a state of the fuse after performing the fuse blow, wherein inverting the at least one bit is based at least in part on determining the state.

19. The apparatus of claim 18, wherein the controller is further configured to cause the apparatus to:

scramble the column address based at least in part on the state of the fuse associated with scrambling the column addresses of the column plane.

20. The apparatus of claim 17, wherein the controller is further configured to cause the apparatus to:

apply a voltage to the fuse to perform the fuse blow, wherein inverting the at least one bit is based at least in part on applying the voltage.

* * * * *